United States Patent [19]
Herndon et al.

[11] Patent Number: 5,345,365
[45] Date of Patent: Sep. 6, 1994

[54] INTERCONNECTION SYSTEM FOR HIGH PERFORMANCE ELECTRONIC HYBRIDS

[75] Inventors: Terry O. Herndon, Carlisle, Jack I. Raffel, Lexington, both of Mass.

[73] Assignee: Massachusetts Institute of Technology, Cambridge, Mass.

[21] Appl. No.: 878,495

[22] Filed: May 5, 1992

[51] Int. Cl.$^5$ .............................................. H05K 7/02
[52] U.S. Cl. .................................. 361/760; 361/765; 361/772; 361/777; 439/65
[58] Field of Search ............... 361/760, 761, 765, 772, 361/776, 774, 777–779, 773, 775; 174/52.4; 257/678, 686, 690, 692, 697; 29/832, 842; 439/65–66, 91

[56] References Cited

U.S. PATENT DOCUMENTS

| | | | |
|---|---|---|---|
| 4,813,129 | 3/1989 | Karnezos | 29/832 |
| 4,924,353 | 5/1990 | Patraw | 361/400 |

FOREIGN PATENT DOCUMENTS

| | | |
|---|---|---|
| 0295914A2 | 12/1988 | European Pat. Off. |
| 4006841 | 10/1992 | Japan |
| WO90/06592 | 6/1490 | PCT Int'l Appl. |
| WO85/00467 | 1/1985 | PCT Int'l Appl. |
| WO87/04009 | 7/1987 | PCT Int'l Appl. |

OTHER PUBLICATIONS

Article: Hiroshi Yamada, 1992, IEEE/CHMT Int'l Electronics Manufacturing Technology Symposium, pp. 288–292, A fine pitch and high aspect ratio bump array for flip-chip interconnection.

Article: Kulesza et al., Feb. 1992, The Magazine for Advanced Packaging Solutions, 6 pages, Hybrid Circuit Technology.

Article: Feb. 1989, AT&T Elastomeric Conductive Polymer Interconnect, 4 pages.

Article: 1992, Scotch Brand 9703 Conductive Adhesive Transfer Tape, 4 pages.

Wafer–Scale Systems Technology for Strategic Computing Program, ESD–TR–91–068, Massachusetts Institute of Technology Lincoln Labs, Mar. 31, 1991 Report, Issued May 10, 1991, pp., 25–27.

*Primary Examiner*—Leo P. Picard
*Assistant Examiner*—Bot Ledynh
*Attorney, Agent, or Firm*—Wolf, Greenfield & Sacks

[57] ABSTRACT

An interconnection system for high performance electronic hybrids employs micro-machined features on a substrate to connect directly to miniature electronic components, such as integrated circuits. The micro-machined features may include posts for connecting to bonding pads of standard components and may also include rails for alignment of components and connections to specially made components.

9 Claims, 11 Drawing Sheets

INTERCONNECTION SYSTEM FOR HIGH PERFORMANCE ELECTRONIC HYBRIDS

This invention was made with government support under contract Number F19628-90-C-0002 awarded by the United States Air Force. The government has certain rights in the invention.

BACKGROUND OF THE INVENTION

1. Field of the Invention

The present invention relates to methods and apparatus for interconnecting and packaging miniature electronic components, such as integrated circuit chips and other devices to form larger systems.

2. Description of the Prior Art

Miniature electronic components are presently interconnected by a number of different schemes. A non-exhaustive list of such interconnection schemes includes: encapsulating the components in packages having leads which may be soldered to a substrate or inserted in a socket; tape automated bonding (TAB); and several hybridizing techniques wherein components are adhered to a substrate and connections are made by fine bonding wires, microscopically welded from bonding pads on the components to bonding pads on the substrate.

A more recent improvement to the hybridizing technique involves the placement of solder balls on substrate bonding pads located in a pattern matching the component bonding pads, placing the component on the substrate so that the component bonding pads align with the substrate bonding pads, and heating the combination so as to melt the solder. This technique results in a very good connection, because the surface tension of the melted solder helps align the component properly with the substrate, forming a good electrical and mechanical bond. However, the assembly is difficult to take apart if a single component needs to be repaired or replaced because the heating required to loosen one component may weaken bonds or cause bond to bond shorting due to reflow of solder attaching bonding pads of another component, not otherwise in need of repair.

The interconnection systems of the prior art result in either bulky systems as a result of package and lead frame size constraints or systems which are difficult to repair, such as the hybrids discussed above.

Bulky systems are disadvantageous because large spacing between components and consequently long interconnection wires results in high undesirable capacitance, high undesirable inductance and high undesirable signal propagation delays in the interconnection wiring. These characteristics limit the maximum usable speed of such systems. Furthermore, in systems using individual lead frames or device packages, up to one-half of the cost of a device may be the cost of the package.

Although hybridizing may somewhat relieve the space problem, current hybridizing techniques result in permanent assemblies, which may not be easily or economically repaired. For example, if a hybrid including three components contains one faulty component, the entire hybrid may be discarded, wasting the two good components and the expensive substrate. Therefore, it is not economical to build compact, large-scale systems by hybridization.

Thus, it is the overall aim of the present invention to provide an improved interconnection system for miniature components, such as integrated circuit chips.

SUMMARY OF THE INVENTION

The forgoing aim, as well as other objects and advantages of the present invention such as may be readily apparent to those skilled in the art are achieved in a system for electrically interconnecting several electrical contacts on a surface of at least one miniature electronic component. The system includes a substrate, several raised elements on the substrate and conductive wiring on the substrate and the several raised elements.

The miniature electronic components are received onto a surface of the substrate, having the several raised elements. Among the several raised elements are raised elements positioned to engage the several electrical contacts on the surface of the miniature electronic components. The conductive wiring extends over those raised elements positioned for engagement with the electrical contacts, such that when a component is positioned, aligned and pressed against the raised portions, electrical connections are formed between the bonding pads of the component and the conductive interconnect layer. The pressure on the component may be provided through a pressure plate by a clamp means.

In one embodiment of a pressure plate and clamp means, the substrate includes a layer of material of suitable strength, such as a metal plate, having holes at extreme ends. A metal bar, or a bar of another suitable material may then be fitted over the components, and clamped down with screws or other fasteners inserted through the holes. Many other fastening devices are available to those skilled in the art, such as spring clips, C-clamps, and screw/nut/washer combinations.

According to some embodiments of the present invention, the substrate may be a silicon wafer, or a portion thereof or a silicon film disposed on another, underlying substrate material. The raised portions may be formed by micro-machining them in a layer of polyimide disposed on the surface of such a silicon substrate. The micro-machining may be accomplished by known techniques, for example, plasma etching.

Cooling may be assisted in some embodiments of the invention. In some embodiments, the pressure plate is in direct contact with power-dissipating components, thus providing a heat-sink function. Other embodiments use a sack which may contain a non-compressible fluid, also serving a heat-sink function.

The present invention may be more fully understood by reading the detailed description, below, with reference to the accompanying drawings, wherein like numerals represent like elements.

DETAILED DESCRIPTION

Several embodiments of the present invention are now described in connection with the figures.

Figure 1A:
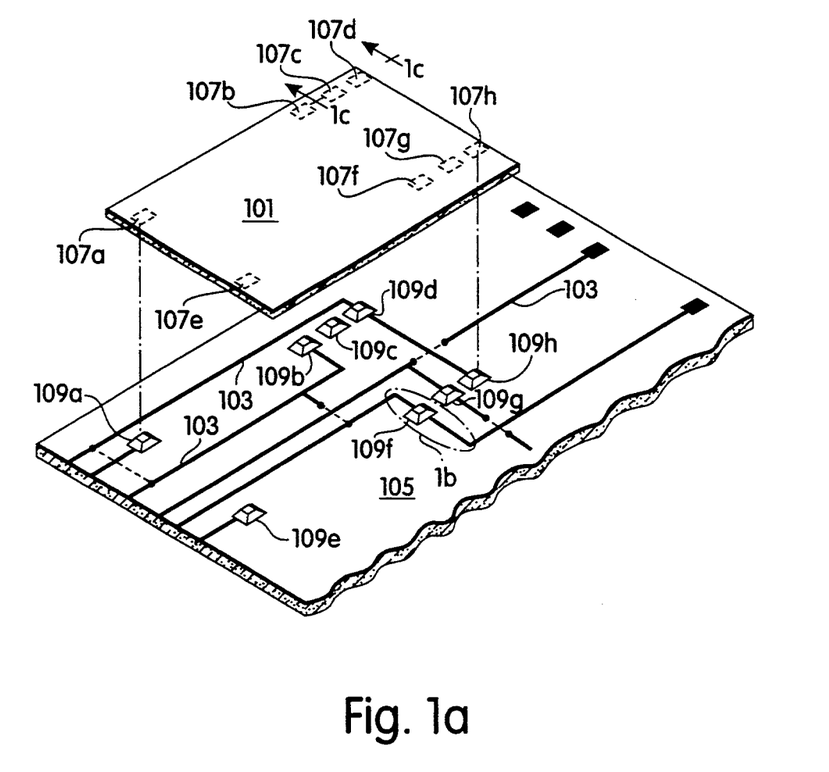
FIG. 1a is an exploded, perspective view of an embodiment of the present invention, as applied to integrated circuit chip interconnection.

FIG. 1a illustrates an embodiment of the present invention in which an integrated circuit chip 101 includes conductive bonding pads 107a–107h for interconnection with other integrated circuit chips and other devices (not shown) through wiring (e.g., metal conductors) 103 disposed on substrate 105. Bonding pads 107a–107h are disposed on one surface of integrated circuit chip 101 which, in the figure, faces substrate 105. Bonding pads to be interconnected, such as 107a–107h, are arranged in a predetemined pattern. Disposed on the substrate are a corresponding number of contact sites, which in this embodiment include raised posts 109a–109h. Wiring 103 forms a pattern which runs over the top of those posts to which electrical connection is desired (e.g., FIG. 1b, Post 109f). Each Post 109a–109h corresponds to one of the bonding pads 107a–107h. The pattern formed by posts 109a–109h corresponds with the predetermined pattern formed by bonding pads 107a–107h, such that when integrated circuit chip 101 is brought into close proximity with substrate 105, in the correct orientation, mechanical contact may be effected between wiring 103 at the top of each post 109a–109h and the corresponding conductive bonding pad 107a–107h.

Integrated circuit chips 101 generally include a protective layer of glass or another insulating material (FIG. 1c, 111), covering the surface of the device and having openings at the bonding pad 107a–107f locations. In a representative process, the glass may be approximately 1 micron thick, while the bonding pads may be squares approximately 100 microns on a side. In order to accommodate these dimensions, and allow for some tolerance, it is desirable to form resilient posts approximately 4-6 microns high. Posts have been micro-machined to dimensions of approximately 11–20 microns on a side at the base and approximately 1–5 microns on a side at the top. These dimensions are clearly small enough to enter the 100 micron square openings to the bonding pads, and result in additional advantages as seen below.

Figure 1B:
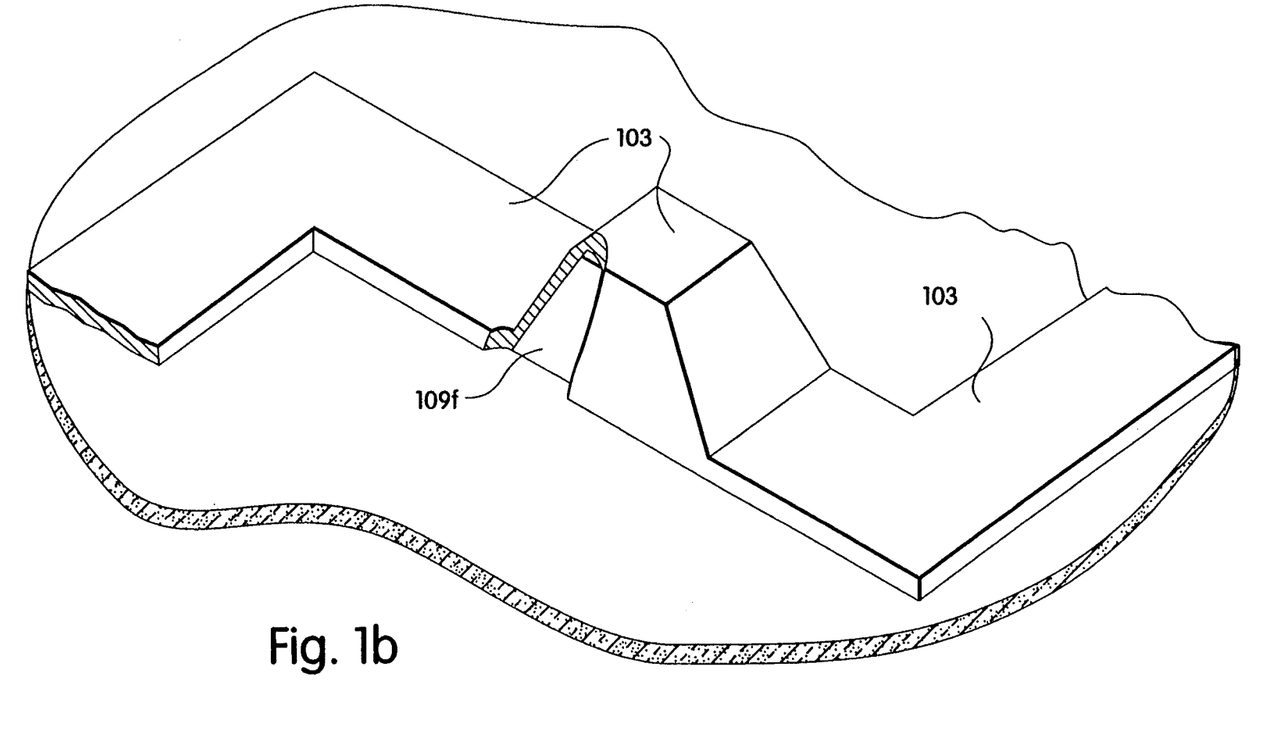
FIG. 1b is a cutaway, detail view of the area in FIG. 1a designated 1b, and showing a post for making an electrical connection.
Figure 1C:
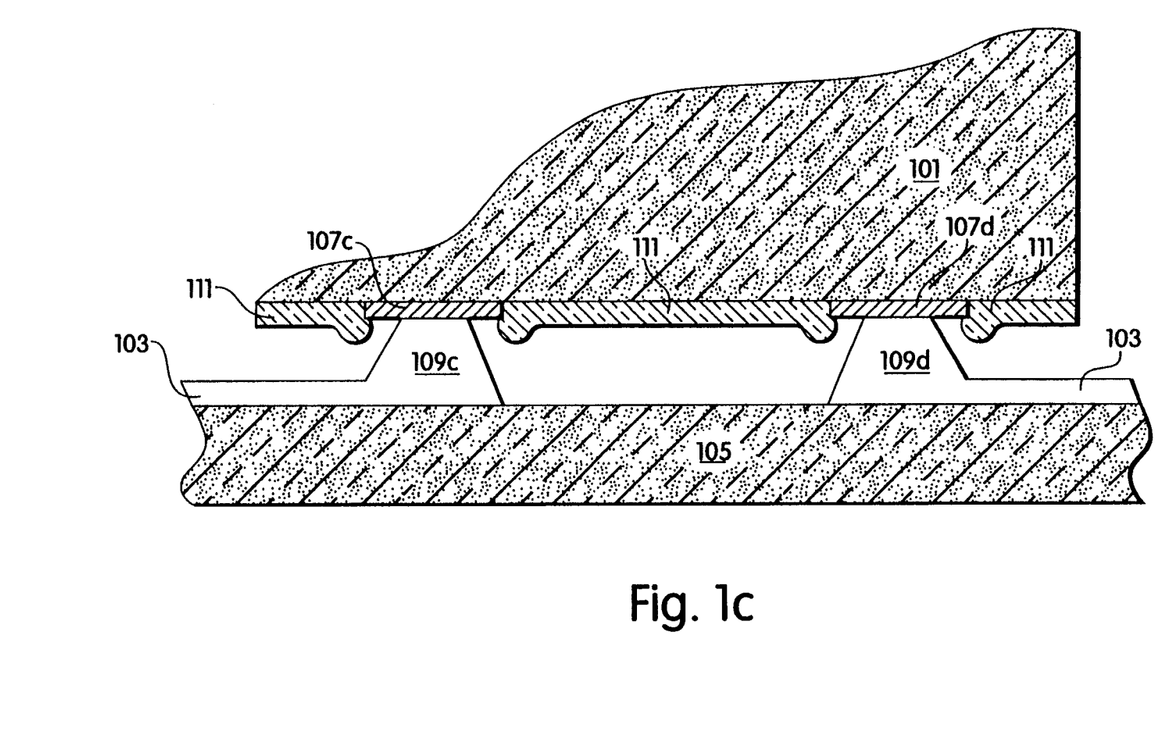
FIG. 1c is a cutaway, cross-sectional view taken through line 1c—1c in FIG. 1a. The elements of FIG. 1a are assembled in this view.

As noted above in connection with FIG. 1b, a small post such as 109f, for example, having a portion of wiring 103 over the top contacts a device's bonding pad 107f through an opening in the protective glass 111 covering integrated circuit chip 101, as further illustrated in FIG. 1c. Thus, integrated circuit chip 101 is electrically interconnected to other chips or devices disposed on substrate 105 through wiring 103.

One issue of concern in the embodiment of FIGS. 1a–1c is properly aligning the predetermined pattern of bonding pads 107a–107h on integrated circuit chip 101 with the predetermined pattern of posts 109a–109h. Although this could be done optically, for example with a microscope, it is preferable that the system be mechanically self-aligning. Features for accomplishing mechanical self-alignment are illustrated in FIGS. 2 and 3.

Figure 2:
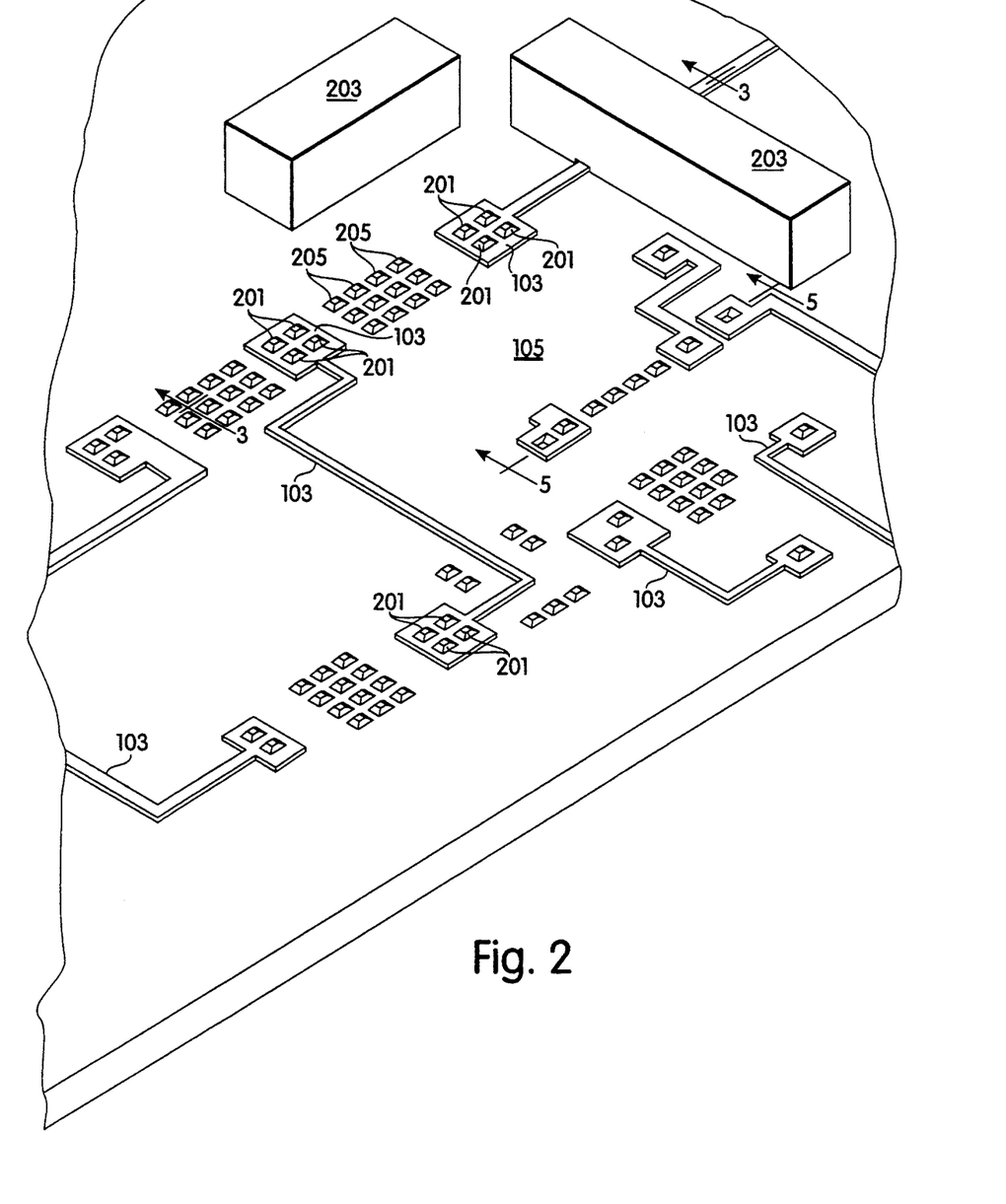
FIG. 2 is a more detailed enlarged perspective view of another embodiment of a chip-receiving substrate according to the present invention.

FIG. 2 shows in greater detail a portion of a substrate 105, at a site where an integrated circuit chip 101 is to be placed, prior to the placement thereof. As described in connection with FIGS. 1a–1c, the substrate 105 carries interconnecting wiring 103. In this embodiment, each bonding pad of the integrated circuit chip (not shown) corresponds with between one and four posts 201. The reasons for and advantages of varying the number of posts 201 corresponding with each bonding pad are discussed below. As before, a connection is made between wiring 103 and each bonding pad of the integrated circuit chip (not shown) where wiring 103 overlays posts 201. Two additional features of this improved embodiment are now described: alignment fences 203 and limit stops 205. As shown in FIG. 3, alignment fences 203 are positioned so that an integrated circuit chip 101, correctly oriented, and having its sides 301 resting against sides 303 of alignment fences 203 will be aligned so that bonding pads 107 are correctly positioned for engagement with wiring 103, overlying posts 201. An integrated circuit chip 101 may be so positioned manually by placing it on substrate 105 approximately in the desired position, holding the substrate in a sloping position to allow gravity to urge integrated circuit chips 101 down toward alignment fences 203, and tapping substrate 105 lightly with a finger. This procedure thus facilitates field replacement of integrated circuit chips without requiring special alignment equipment. Alternatively, the procedure may be automated by use of a vibration table, which vibrates the integrated circuit chips from their approximate placement to a final position in contact with alignment fences 203. The top of the alignment table, or a fixture thereon may hold the substrate in a sloping position to allow gravity to urge integrated circuit chips 101 down toward alignment fences 205. In order to properly retain integrated circuit chips 101 during the foregoing procedure, alignment fences 203 of 25 microns and various other heights have been used, although the optimum height may vary greatly with the alignment technique used and the dimensions of the chips and posts.

Figure 3:
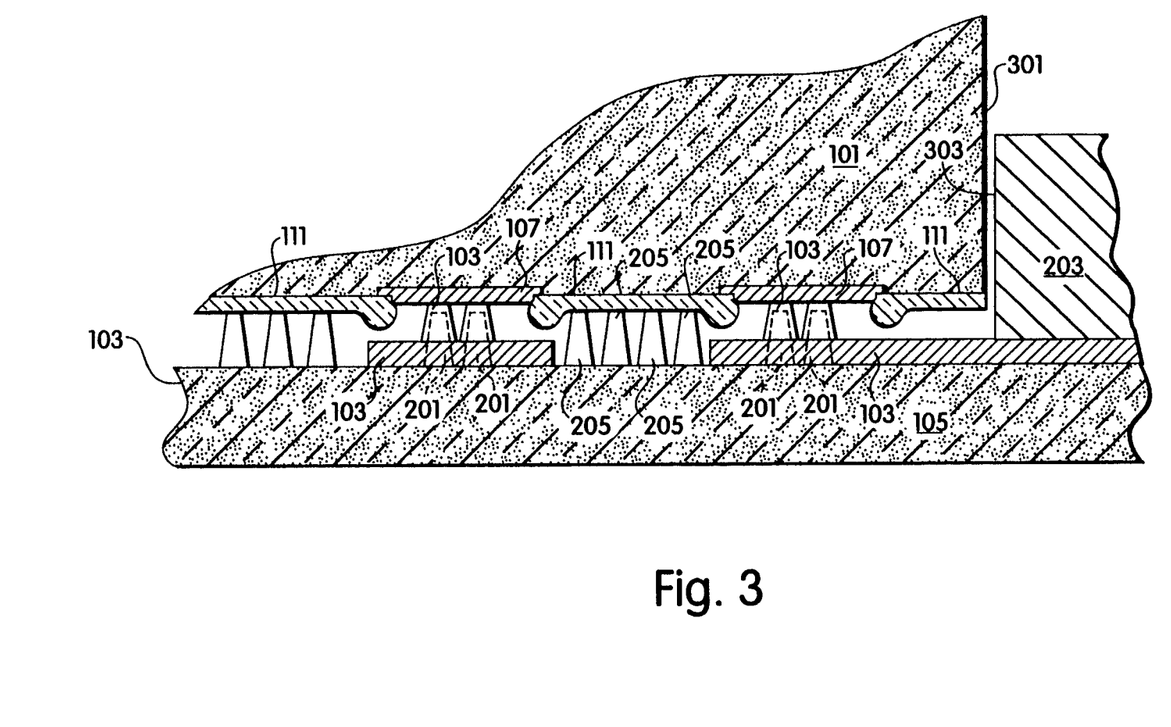
FIG. 3 is a cross-sectional view taken through line 3—3 in FIG. 2, further having an integrated circuit chip installed.

To form good electrical contacts, exhibiting low contact resistance between wiring 103, overlying posts 201 and bonding pads 107, as shown in FIG. 3, pressure is applied to urge together integrated circuit chip 101 and substrate 105. One embodiment of a mechanism which accomplishes this urging is shown in FIG. 4.

Figure 4:
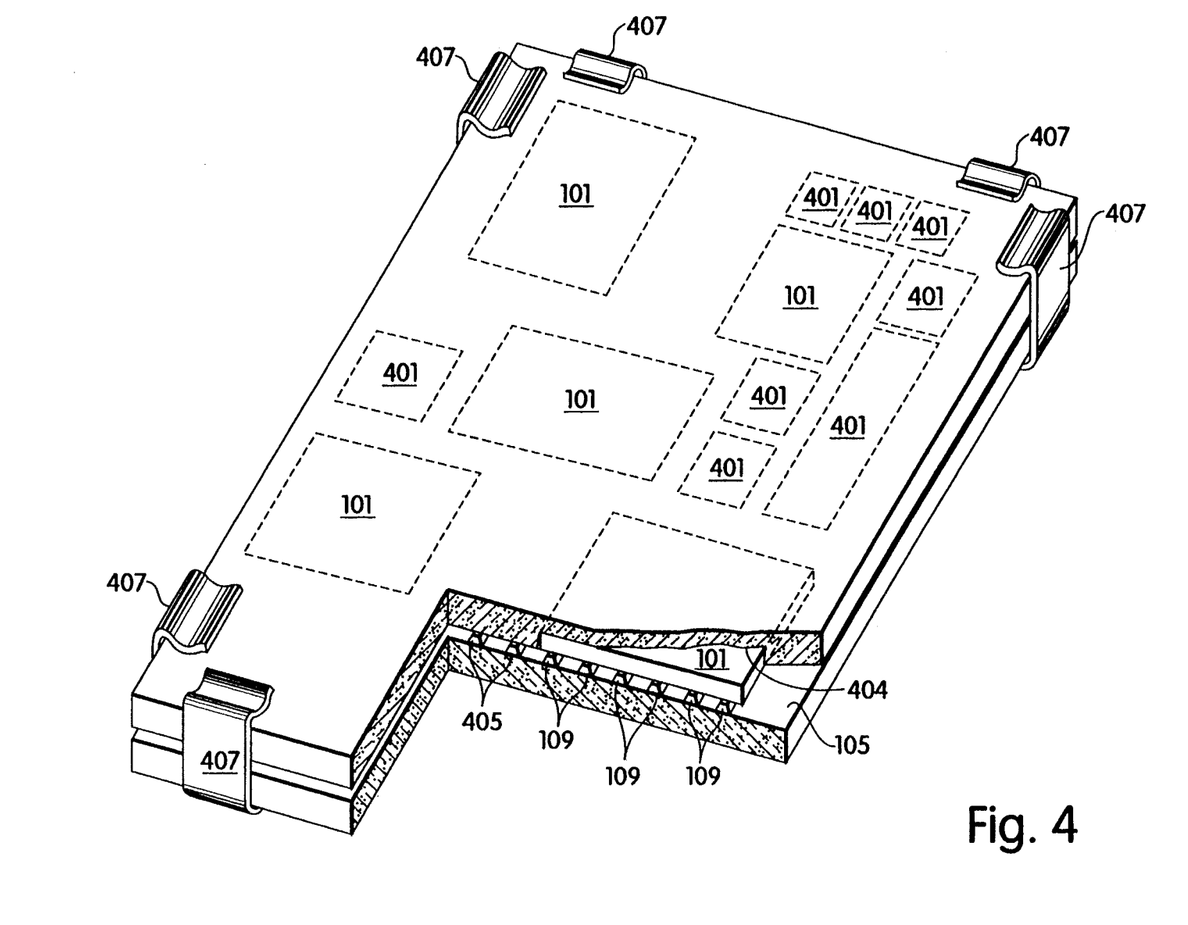
FIG. 4 is a cutaway, perspective view of an embodiment of the present invention having a pressure plate to provide contact force between components, such as integrated circuits, and an interconnection substrate. Phantom lines indicate the location of components including integrated circuit chips and other devices between the pressure plate and the substrate.

FIG. 4 shows an embodiment of the present invention having a pressure plate 403 over a number of integrated circuit chips 101 and other devices 401. The large pressure plate 403 applies pressure uniformly to each of the integrated circuit chips 101 and devices 401. In order that chips 101 and devices 401 may be of various thicknesses, pressure plate 403 may include recesses or cavities 404 having various depths which compensate for the various thicknesses, so as to bring the exposed surfaces of chips 101 and devices 401 into planar alignment. In addition, the pressure plate may include its own wiring, for bringing power or ground connections or signals to or from substrate 105 via posts 405 provided for, that purpose.

FIG. 4 also shows one embodiment of a clamp means for applying pressure to the pressure plate 403. Spring clips 407 (only two shown) may be distributed about the periphery of pressure plate 403 and substrate 105. By applying balanced numbers of clips to opposing edges, an even, distributed force may be applied by pressure plate 403 to chips 101 and devices 401.

Contact resistance is an important characteristic which is a function of a number of the parameters discussed up to this point. In particular, the more significant parameters are the pressure between the wiring overlying each post and the corresponding bonding pad, and the dimensions at the top of each post. In test systems, including 286 small posts having square tops in the range of approximately 2–5 microns on a side, suitable results were obtained over a range of force applied to the pressure plate of approximately 0.3–0.7 lbs. Contact resistances of approximately $1.5 \, \Omega - 1.8 \, \Omega$ have been measured. Larger posts may be used, but when aluminum is used to form the metal layer, an aluminum oxide barrier forms which is difficult to break down by pressure alone. Raising the pressure too high could damage posts or even damage integrated circuit chips. Too little pressure may result in some connections failing to form properly. Posts having smaller dimensions form connections more readily, and may also be used, but are difficult to cover with the metal wiring 103. Thus, while the ranges discussed are not absolutely limiting, they provide suitable performance characteristics.

It will be appreciated by those skilled in the art that some way of accurately controlling the contact pressure is desirable. Concern about contact pressure variability is exacerbated by the different thicknesses of integrated circuit chips manufactured on different diameter wafers. Thus, a flat pressure plate may not apply uniform pressure to all integrated circuit chips 101 used in a particular design. The pressure plate 403, described above in connection with FIG. 4, improves uniformity over that of a flat plate, but further refinement of pressure control is desirable. Because posts 201 are of a resilient material, pressure may be controlled by limiting the degree of deflection of posts 201, and by varying the number of posts 201 used at each contact site.

One approach to limiting post deflection is now discussed in connection with FIGS. 2 and 3. Additional posts, such as posts 205, may be provided in areas adjacent to posts 201. Posts 205 are micro-machined to be shorter than posts 201 by a distance which allows the desired deflection of posts 201, under pressure from pressure plate 403 through IC chip 101. Posts 205 are located in areas where no electrical contact is desired, therefore metal wiring 103 may be routed to avoid posts 205. Thus, the contact pressure is more sensitive to, and may be controlled by intrinsic properties of the materials used, such as the resilience of the post material, the resilience of the integrated circuit chips, the resilience of the pressure plate, and by the difference in heights between posts 201 and posts 205, rather than being sensitive to and controlled only by the force applied to pressure plate 403 or the thickness of integrated circuit chips 101. In one embodiment, a difference of 1.5 microns out of a post height of 3.5 microns was found to be suitable, as illustrated in FIG. 5d, and described below. This approach may not be universally applicable, because protective glass 111 may be of uneven thickness, or may follow underlying topology on chip 101 which results in uneven thickness.

Therefore, another approach to limiting post deflection is also discussed in connection with FIGS. 2 and 3. This approach relates to the advantage alluded to above in varying the number of posts 201 corresponding with each bonding pad. The effective stiffness, and thus the deflection of posts 201 may be varied by varying the number of posts 201 corresponding with each bonding pad. By varying the number of posts 201, a large device having many bonding pads may use fewer posts corresponding with each bonding pad, while a small device having few bonding pads may use many posts 201 corresponding with each bonding pad. Thus, the force between each post 201 corresponding with bonding pads of both the large device and the small device, and each corresponding bonding pad is held roughly constant.

A variation of the approach described immediately above is to also vary the dimensions of the tops of posts 201. A variation between square tops 1 micron on a side and 4 microns on a side is readily achievable. This corresponds to a variation in area, and consequently in distributed force, of 1:16. Thus, a range of devices or chips having varying numbers of contact pads in the ratio of up to 1:16 may be readily accomodated.

Variations in the size of the tops of posts 201 are readily achievable by making changes to the etch mask. Changes in the etch mask size do not linearly track finished sizes of the tops of posts 201 due to loading factors in the etching process. Loading of the etchant is a known phenomenon, which will be compensated for by mask desigers skilled in the art. Various aspects of embodiments of the present invention have been described in connection with FIGS. 1–4. A method of construction, for manufacturing the interconnecting substrate is now described in connection with FIGS. 5a–5d.

A particularly suitable material for manufacturing the system of the present invention is a silicon substrate having a polyimide layer deposited thereon. These materials lend themselves to micro-machining by techniques known in the integrated circuit arts. Polyimide has the necessary resilience, high temperature capability and acceptance as an integrated circuit material to provide the characteristics described above.

Figure 5A:
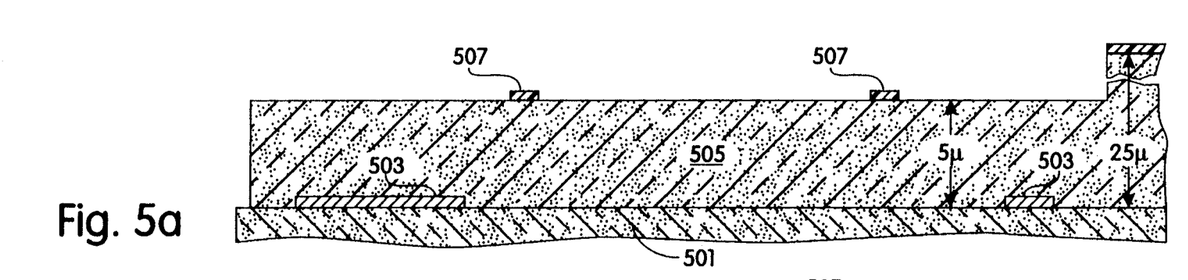
FIGS. 5a–5g are cross-sectional views taken through line 5—5 in FIG. 2 of a substrate in the process of being manufactured according to one embodiment of the present invention.
Figure 5B:
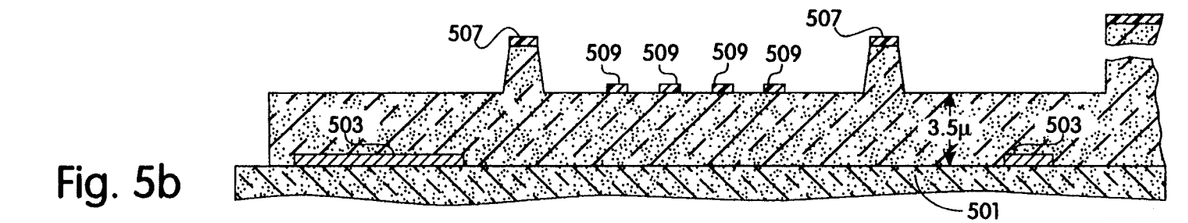

FIG. 5a shows a cross-section of an interconnect module at a stage of processing where several steps have already been performed. A first layer of metal has been deposited on the silicon substrate 501 and etched to form a first layer of interconnect wiring 503. A layer of polyimide 505 has been deposited over the entire silicon substrate surface and the first layer metal wiring 503. A non-erodable mask 504 has been provided where alignment fences are desired. The remaining polyimide is etched to a uniform height. The polyimide 505 will be etched to form posts. In FIG. 5a, a non-erodable mask 507 is provided in the locations where the formation of posts 201 is desired. In this embodiment, the polyimide is 5 microns thick, before etching. Approximately 1.5 microns of polyimide 505 are then etched off. FIG. 5b illustrates this intermediate condition, after an additional non-erodable mask 509 has been applied in preparation for the next step.

In FIG. 5b, a non-erodable mask 509 has been applied in the locations where posts 205 will be etched. Then an additional 2 microns of polyimide 505 are removed by etching. A new layer of non-erodable mask 511 is applied, placing the substrate in the condition shown in FIG. 5c.

Figure 5C:
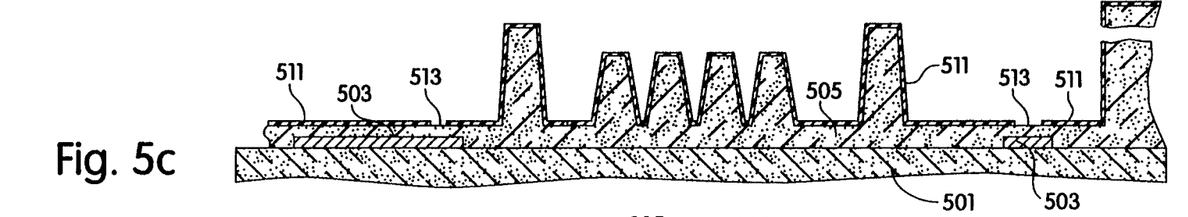
Figure 5D:
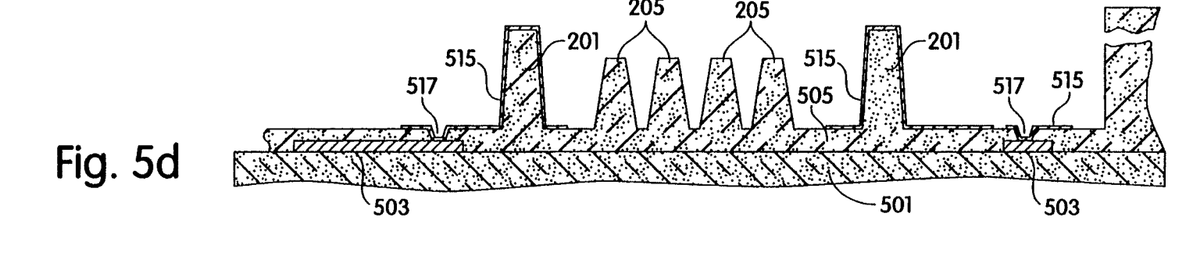

In FIG. 5c, non-erodable mask 511 has been applied to the remaining polyimide, but leaving openings 513 where an interconnecting via (517 in FIG. 5d) will be formed. The surface of the polyimide exposed through openings 513 is then etched down to the first layer metallization 503. After applying a second layer of metal 515, the structure is as shown in FIG. 5d.

The final structure of FIG. 5d includes a second layer of interconnect wiring 515, connected to the first layer interconnect wiring 503 by via 517. Interconnect wiring 515 runs over the tops of posts 201. Thus, wiring 503 and 515 and vias 517 correspond with wiring 103 of FIGS. 1 and 2. Posts 201 function as described earlier in connection with FIGS. 1-3. Posts 205 operate as described above in connection with FIGS. 2 and 3. Thus, the contact force between wiring 151 at the tops of posts 201 and the bonding pads of an integrated circuit chip or other device placed in contact therewith is controlled by the difference in height between posts 201 and posts 205.

It may be readily seen that the method described above may also be used to produce other post configurations, such as those discussed above. For example, non-erodable mask 507 may be patterned to produce multiple posts corresponding with each bonding pad of a device to be connected. Also, non-erodable mask 509 may be omitted entirely if posts 205 are not desired in the finished system.

Figure 5E:
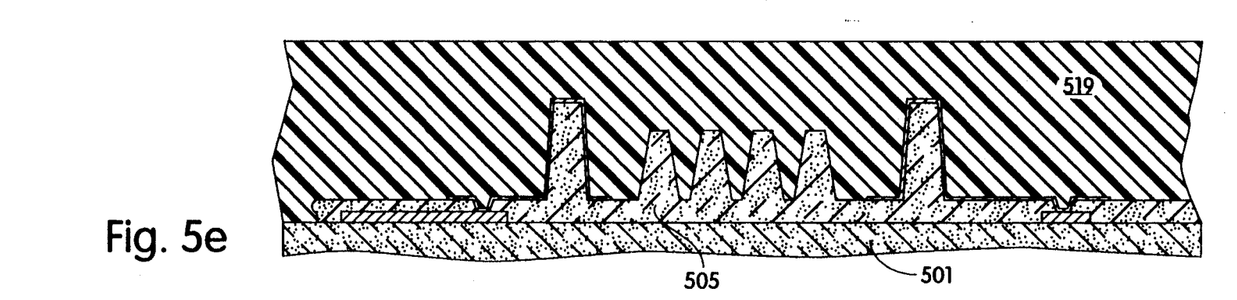
Figure 5F:
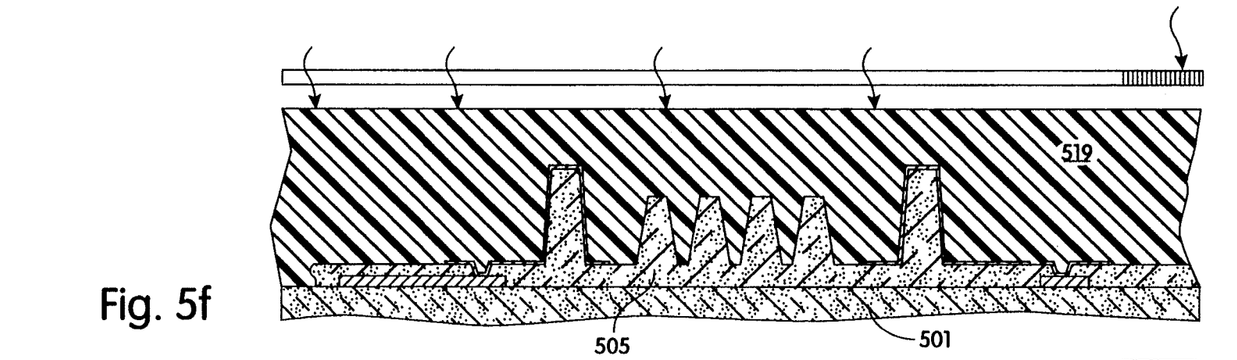
Figure 5G:
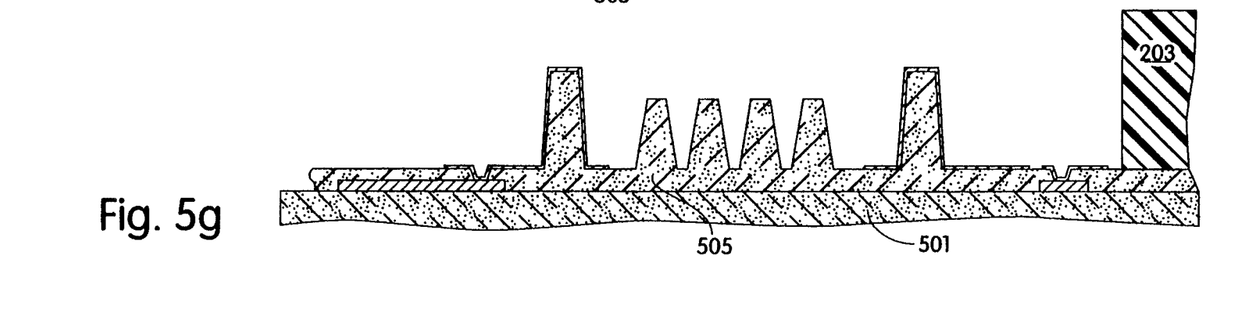

In an alternative method, alignment fences 203 may be omitted from the structures of FIGS. 5a-5d, and added after formation of posts 201 and 205. Portions of the structure of FIG. 5d may be coated with a 25 micron layer of photosensitive polyimide 519; exposed through a mask; developed away; and cured as shown in the sequence of FIGS. 5e-5g.

Figure 6:
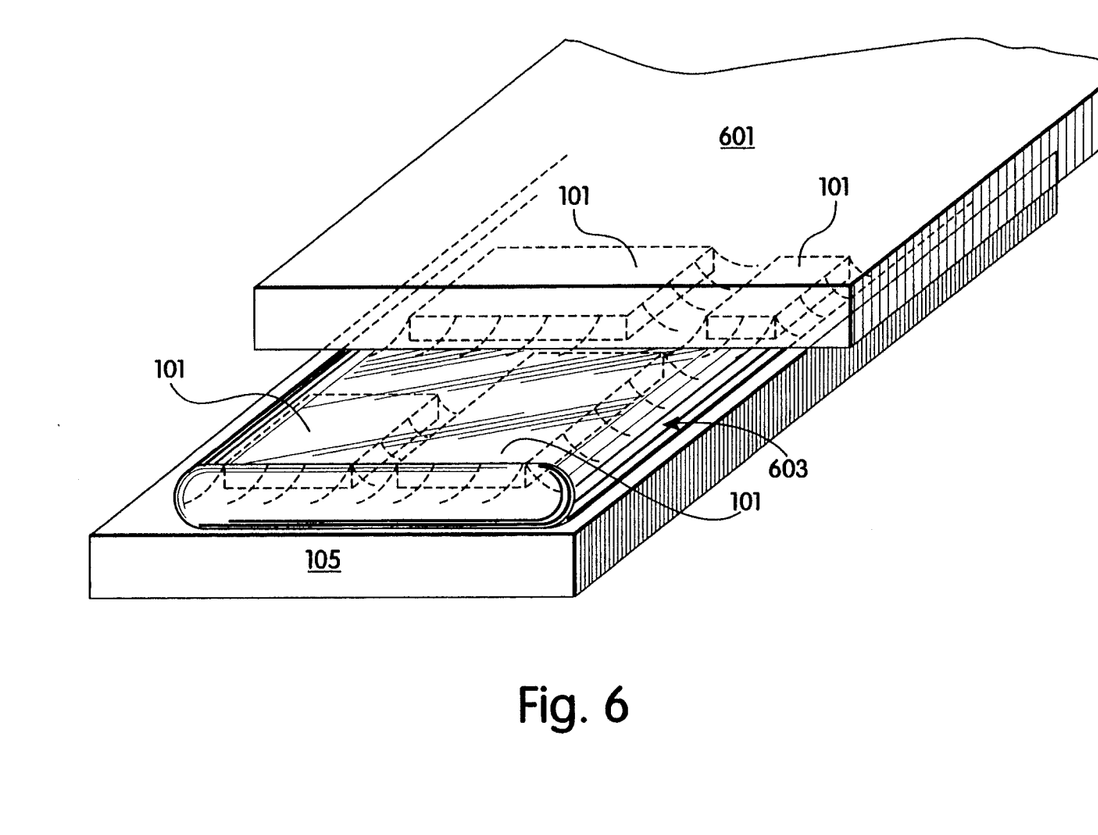
FIG. 6 is an exploded, perspective view of an embodiment of the present invention, employing a fluid or foam-filled sack to evenly distribute pressure over the integrated circuits of the system.

Some alternate embodiments of the present invention are now discussed in connection with FIGS. 6-8.

Both positive and negative photosensitive polymers such as polyimide are known. Thus, the masked regions may be either the regions to be removed or the regions desired to remain, depending on the polymer type. Also, other suitable materials and methods of manufacture may be used to produce alignment fences 203. For example, 2-3 mils etched metal web or precision molded plastic web could be optically positioned and affixed to form alignment fences 203. The embodiment shown in FIG. 6 illustrates one way of achieving more uniform pressure applied to integrated circuit chips 101. This embodiment uses a flat pressure plate 601 and a flexible member 603. Pressure is applied indirectly to integrated circuit chips 101 by pressure plate 601 through the flexible member 603. Member 603 may be a sack filled with either compressible or non-compressible materials. Compressible materials used by themselves or within a sack, such as foam, may provide a designer with additional control over applied pressure. Non-compressible materials, such as non-compressible fluids distribute the pressure more evenly. Furthermore, materials with excellent thermal conductivity characteristics may be used to assist in cooling integrated circuit chips 101 by acting as an additional heat-sink.

Figure 7:
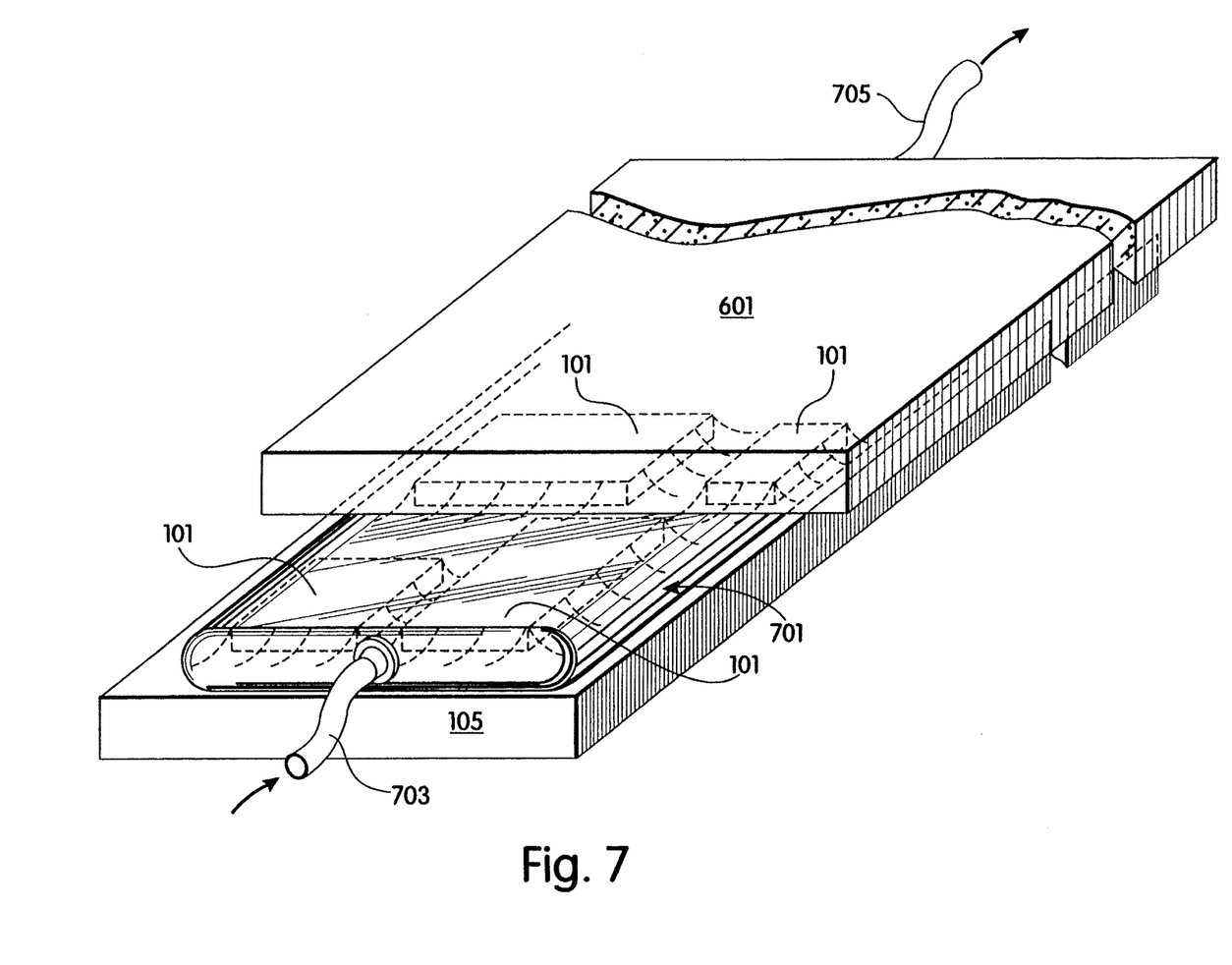
FIG. 7 is an exploded perspective view of a similar embodiment to that of FIG. 6, but wherein a cooling fluid may be circulated through the sack.

Another embodiment employing a sack filled with a fluid is shown in FIG. 7. In this embodiment, sack 701 may be filled with a pressurized refrigerant, such as a fluorocarbon. Chilled refrigerant may be supplied through supply tube 703, as spent refrigerant is withdrawn through return tube 705. This embodiment could be used for extremely dense systems, where power dissipation can become a problem. The circulating refrigerant, thus described, is an excellent heat-sink.

Figure 8A:
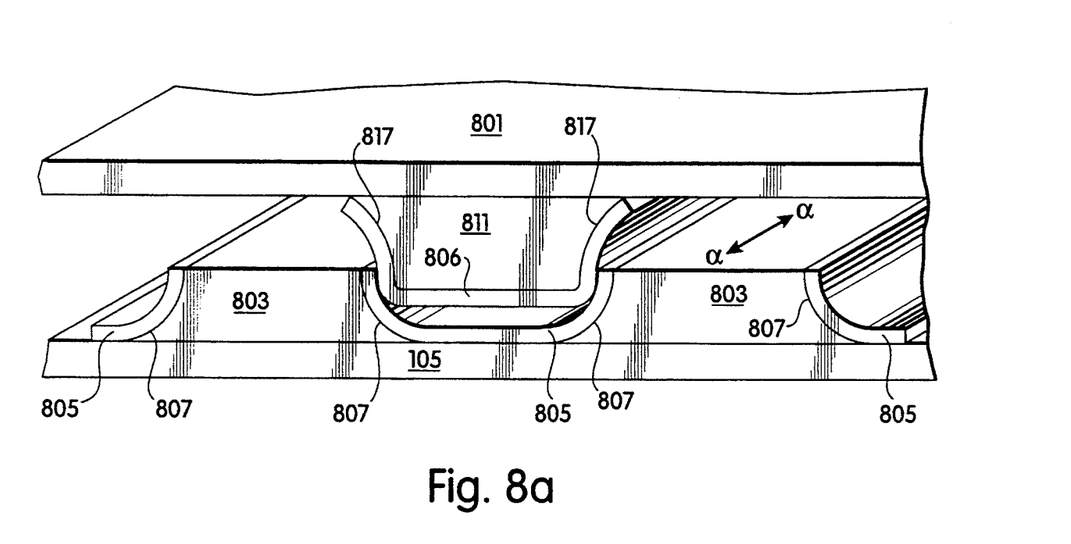
FIGS. 8a and 8b are end perspective views of other embodiments of the present invention, useful for connecting signals on two silicon substrates.
Figure 8B:
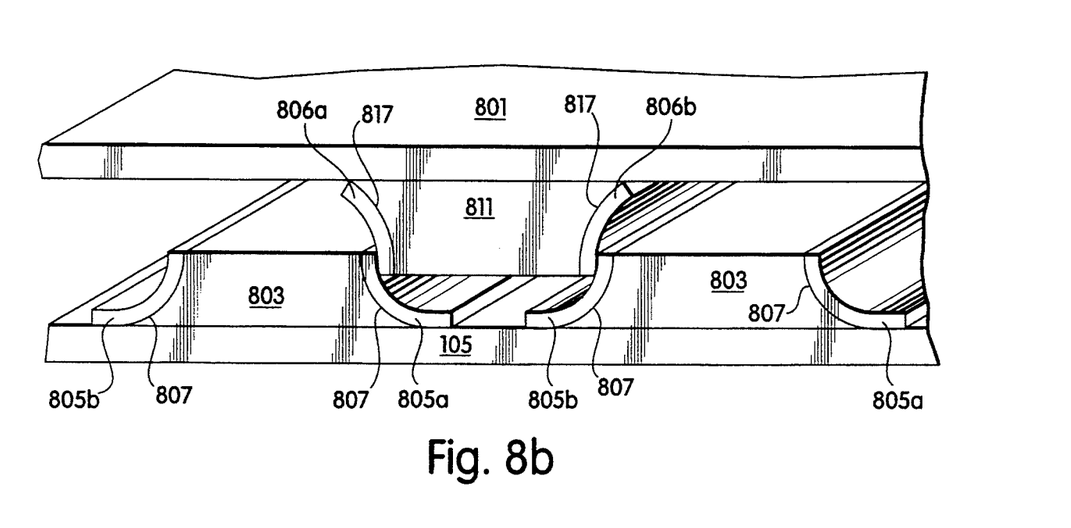

In the embodiments of FIGS. 8a and 8b, the present invention may be used as a subminiature connector between a subminiature device 801 and ordinary, macroscopic circuitry, through wires disposed on substrate 105. Posts 109 of FIG. 1 are elongated in one direction (a—a) on the surface of substrate 105 to form rails 803. Instead of simple bonding pads 107 as shown in FIG. 1, device 801 has corresponding contact rails 811. Wiring 805 and 806 covers at least the side wall 807 and 817 of each rail 803 and 811 where a connection is to be made. As shown in FIG. 8b, wiring 805 and 806 may be divided into electrically isolated tracer 805a, 805b, 806a, and 806b. The dimensions of rails 811 are selected so that when placed in alignment, as shown in FIGS. 8a and 8b, rail 811 contacts rail 803 only between side wall 807 and side wall 817. Rails 811 and 803 perform both the functions of the post 201 and of the alignment fences 203 of the earlier-described embodiments (FIGS. 2-3). In cross-section, rails 803 and 811 have dimensions similar to those given in connection with FIGS. 1-5. Each rail may extend in the elongated direction (a—a) for many mils. Thus, these embodiments are self-aligning and capable of supporting extremely high contact densities.

The invention has now been described in connection with a number of embodiments. These embodiments are not to be considered as limiting, the scope of the present invention is limited only by the appended claims. Numerous additional embodiments which would be obvious to those skilled in this art are contemplated as falling within the scope of the claims.

What is claimed is:

1. A system for electrically interconnecting a plurality of electrical contacts disposed on a surface of a plurality of miniature electronic components, said system comprising:

a substrate for receiving said at least one miniature electronic component;

a plurality of raised elements disposed on said substrate, including a plurality of raised elements positioned for corresponding engagement with said plurality of electrical contacts of each said component; and conductive wiring disposed on said substrate and further extending over said plurality of raised elements positioned for corresponding engagement with said plurality of electrical contacts; and means for applying a force between said at least one component and said plurality of raised elements to urge said electrical contacts into intimate engagement with said conductive wiring extending over said plurality of raised elements and thus to establish and maintain electrical connections there between, including a pressure plate for receiving a force from said means for applying a force and means disposed in engagement with said plurality of components for causing a force received by said pressure plate to be evenly distributed across said plurality of components.

2. A system as defined in claim 1, wherein said means for causing a force received by said pressure plate to be evenly distributed further comprises:
   a plurality of recesses defined in said pressure plate for receiving said plurality of components and having depths such that each said surface of said plurality of components on which said electrical contacts are disposed are coplanar when said plurality of components have been received.

3. A system as defined in claim 1, wherein said means for causing a force received by said pressure plate to be evenly distributed further comprises:
   a sack filled with a non-compressible fluid, disposed between said pressure plate and said plurality of components.

4. A system as defined in claim 3, wherein said sack further comprises:
   means for accepting the introduction of a flow of fluid into said sack; and
   means for allowing the extraction of a flow of fluid from said sack.

5. A system as defined in claim 1, wherein said means for causing a force received by said pressure plate to be evenly distributed further comprises:
   compressible material, disposed between said pressure plate and said plurality of components.

6. A system as defined in claim 5, wherein said means for causing a force received by said pressure plate to be evenly distributed further comprises:
   a sack for containing the compressible material.

7. A system as defined in claim 1, wherein said means for causing a force received by said pressure plate to be evenly distributed further comprises:
   a quantity of compressible foam, disposed between said pressure plate and said plurality of components.

8. A system for electrically interconnecting a plurality of electrical contacts disposed on a surface of at least one miniature electronic component including at least one alignment rail having the electrical contacts disposed thereon, said system comprising:
   a substrate for receiving said at least one miniature electronic component;
   a plurality of raised elements disposed on said substrate, including a plurality of raised elements positioned for corresponding engagement with said plurality of electrical contacts of each said component; and
   conductive wiring disposed on said substrate and further extending over said plurality of raised elements positioned for corresponding engagement with said plurality of electrical contacts; and
   means for applying a force between said at least one component and said plurality of raised elements to urge said electrical contacts into intimate engagement with said conductive wiring extending over said plurality of raised elements and thus to establish and maintain electrical connections there between, and wherein
   said plurality of raised elements are sidewalls of mating rails for engaging said at least one alignment ridge.

9. A system for electrically interconnecting a plurality of electrical contacts disposed on a surface of at least one miniature electronic component having sides, said system comprising:
   a substrate for receiving said at least one miniature electronic component;
   a plurality of raised elements disposed on said substrate, including a plurality of raised elements positioned for corresponding engagement with said plurality of electrical contacts of each said component; and
   conductive wiring disposed on said substrate and further extending over said plurality of raised elements positioned for corresponding engagement with said plurality of electrical contacts; and
   means for applying a force between said at least one component and said plurality of raised elements to urge said electrical contacts into intimate engagement with said conductive wiring extending over said plurality of raised elements and thus to establish and maintain electrical connections there between, and wherein
   said plurality of raised elements include alignment fences for properly aligning said components when said sides are in intimate contact with said alignment fences.

* * * * *